(12) United States Patent
Agrawal et al.

(10) Patent No.: US 8,633,764 B2
(45) Date of Patent: Jan. 21, 2014

(54) RESTORING OUTPUT COMMON-MODE OF AMPLIFIER VIA CAPACITIVE COUPLING

(75) Inventors: Ankur Agrawal, White Plains, NY (US); John F. Bulzacchelli, Yonkers, NY (US); Thomas H. Toifl, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 188 days.

(21) Appl. No.: 13/157,957

(22) Filed: Jun. 10, 2011

(65) Prior Publication Data
US 2012/0313703 A1    Dec. 13, 2012

(51) Int. Cl.
*H03F 3/00*    (2006.01)
(52) U.S. Cl.
USPC .............................. 330/11; 330/258; 327/336
(58) Field of Classification Search
USPC ..................................... 330/11, 258; 327/336
See application file for complete search history.

(56) References Cited

U.S. PATENT DOCUMENTS

| | | | |
|---|---|---|---|
| 4,833,418 A | 5/1989 | Quintus et al. | |
| 4,975,700 A | 12/1990 | Tan et al. | |
| 5,469,102 A | 11/1995 | Shou et al. | |
| 5,745,002 A * | 4/1998 | Baschirotto et al. | 327/554 |
| 6,362,763 B1 | 3/2002 | Wang | |
| 6,396,329 B1 * | 5/2002 | Zerbe | 327/336 |
| 6,411,166 B2 * | 6/2002 | Baschirotto et al. | 330/258 |
| 6,445,221 B1 * | 9/2002 | Poss | 327/108 |
| 6,774,722 B2 * | 8/2004 | Hogervorst | 330/258 |
| 7,170,349 B2 * | 1/2007 | Bhattacharjee et al. | 330/254 |
| 7,436,216 B1 | 10/2008 | Brunn et al. | |
| 7,560,987 B1 * | 7/2009 | Cetin et al. | 330/258 |
| 7,564,306 B2 * | 7/2009 | Lee et al. | 330/258 |
| 7,605,645 B2 * | 10/2009 | Morie et al. | 327/563 |
| 7,728,620 B2 | 6/2010 | Kuzmenka | |
| 7,746,171 B2 * | 6/2010 | Ali | 330/259 |
| 7,760,013 B2 | 7/2010 | Bankman et al. | |
| 7,792,185 B2 | 9/2010 | Bulzacchelli et al. | |
| 2007/0268047 A1 | 11/2007 | Hopkins et al. | |
| 2009/0051421 A1 | 2/2009 | Mathe | |
| 2009/0160522 A1 | 6/2009 | Van Den Brande et al. | |

OTHER PUBLICATIONS

S. Sidiropoulos et al., "A 700-Mb/s/pin CMOS Signaling Interface Using Current Integrating Receivers," IEEE Journal of Solid-State Circuits, May 1997, pp. 681-690, vol. 32, No. 5.
M. Park et al., "A 7Gb/s 9.3mW 2-Tap Current-Integrating DFE Receiver," IEEE International Solid-State Circuits Conference (ISSCC), Digest of Technical Papers, Feb. 2007, pp. 230-231.
L. Chen et al., "A Scalable 3.6-to-5.2mW 5-to-10Gb/s 4-tap DFE in 32nm CMOS," IEEE International Solid-State Circuits Conference (ISSCC), Digest of Technical Papers, Feb. 2009, pp. 180-181.

* cited by examiner

*Primary Examiner* — Patricia Nguyen
(74) *Attorney, Agent, or Firm* — Anne V. Dougherty; Ryan, Mason, & Lewis, LLP

(57) ABSTRACT

An apparatus comprises an amplifier circuit comprising at least one output node and a common-mode restoration circuit capacitively coupled to the at least one output node of the amplifier circuit. The common-mode restoration circuit is configured to introduce at least one common-mode restoring signal onto the output node, wherein the at least one common-mode restoring signal transitions in correspondence with an operation interval of the amplifier circuit and thereby compensates for a common-mode voltage drop on the at least one output node of the amplifier circuit. In one example, the amplifier circuit may comprise a current-integrating amplifier circuit, and the operation interval may comprise an integration interval.

23 Claims, 12 Drawing Sheets

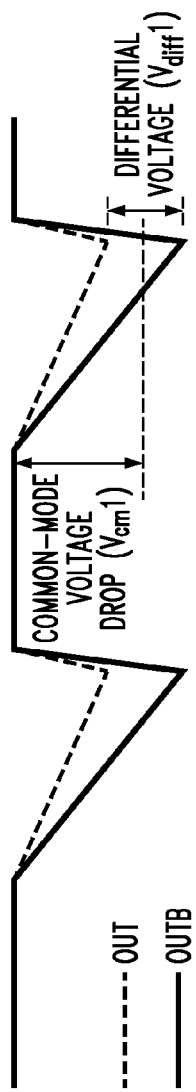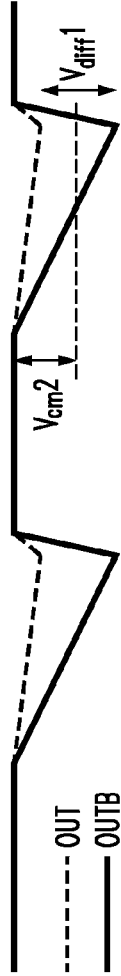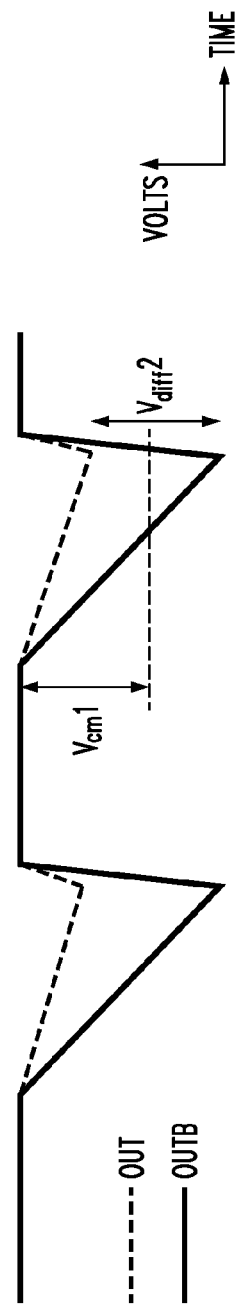
FIG. 5A
FIG. 5B
FIG. 5C
FIG. 5D

RESTORING OUTPUT COMMON-MODE OF AMPLIFIER VIA CAPACITIVE COUPLING

FIELD OF THE INVENTION

The present invention relates generally to electronic circuits and, more particularly, to amplifier circuits and techniques to compensate such circuits for the common-mode drop on their output nodes.

BACKGROUND OF THE INVENTION

The continued shrinking of process geometries in complementary metal oxide semiconductor (CMOS) technologies has led to unprecedented growth in the processing power of digital computing systems. While these systems are predominantly composed of digital circuits, they also contain some high performance analog circuits. For example, circuits for inter-chip communication employ high-speed amplifiers and equalizers in their datapath. Operation at reduced supply voltages is one of the most difficult challenges in designing these analog circuits in modern deep sub-micron CMOS technologies. In particular, reduced supply voltages make it difficult to choose output common-mode voltages for these amplifiers that are suitable for meeting their gain and linearity requirements.

SUMMARY OF THE INVENTION

Principles of the invention provide techniques to compensate amplifier circuits for the common-mode drop on their output nodes.

For example, in one aspect of the invention, an apparatus comprises an amplifier circuit comprising at least one output node and a common-mode restoration circuit capacitively coupled to the at least one output node of the amplifier circuit. The common-mode restoration circuit is configured to introduce at least one common-mode restoring signal onto the output node, wherein the at least one common-mode restoring signal transitions in correspondence with an operation interval of the amplifier circuit and thereby compensates for a common-mode voltage drop on the at least one output node of the amplifier circuit.

The amplifier circuit may comprise a current-integrating amplifier circuit, and the operation interval may comprise an integration interval. The transition of the common-mode restoring signal is preferably complementary to the common-mode voltage drop on the at least one output node during the integration interval of the current-integrating amplifier circuit. The transition of the common-mode restoring signal preferably comprises one of a rising edge transition and a falling edge transition.

In one or more embodiments, the current-integrating amplifier circuit comprises a differential amplifier with two output nodes such that the common-mode restoration circuit introduces two common-mode restoring signals onto the two output nodes, respectively. Still further, in other embodiments, the current-integrating amplifier circuit may comprise a multi-input amplifier that sums multiple input signals to implement a decision feedback equalizer summer circuit or a feed-forward equalizer summer circuit.

Accordingly, in one embodiment, the common-mode restoration circuit may comprise a single current-starved inverter to generate the two common-mode restoring signals. In another embodiment, the common-mode restoration circuit may comprise two current-starved inverters to generate the two common-mode restoring signals, respectively. In yet another embodiment, the common-mode restoration circuit may comprise at least one differential current switch, wherein the at least one differential current switch represents at least one feedback tap of a decision feedback equalizer summer circuit. In a further embodiment, the common-mode restoration circuit may comprise two simple gating logic circuits to generate the two common-mode restoring signals, respectively.

In one further embodiment, an apparatus comprises a PMOS current-integrating amplifier circuit having two output nodes and an NMOS current-integrating amplifier circuit having two output nodes. The two output nodes of the PMOS current-integrating amplifier circuit are respectively capacitively coupled to the two output nodes of the NMOS current-integrating amplifier circuit such that the NMOS current-integrating amplifier circuit provides output common-mode restoration to the PMOS current-integrating amplifier circuit and the PMOS current-integrating amplifier circuit provides output common-mode restoration to the NMOS current-integrating amplifier circuit.

Principles of the invention also provide methods and integrated circuit aspects that implement the inventive common-mode restoration techniques.

Advantageously, principles of the invention provide solutions for restoring the output common-mode of an amplifier circuit so as to improve its gain and linearity.

These and other features, objects and advantages of the present invention will become apparent from the following detailed description of illustrative embodiments thereof, which is to be read in connection with the accompanying drawings.

BRIEF DESCRIPTION OF THE DRAWINGS

FIG. 1b illustrates use of ideal current sources to reduce common-mode drop on the output of the differential amplifier from FIG. 1a.

FIG. 3 illustrates exemplary waveforms and timing diagrams of the current-integrating amplifier of FIG. 2a.

FIG. 5 illustrates exemplary waveforms for the current-integrating amplifier with and without a common-mode restoration circuit, according to the first embodiment of the invention.

DETAILED DESCRIPTION OF THE INVENTION

Illustrative embodiments of the invention will be described herein in the context of one or more illustrative amplifier circuit architectures. However, it is to be understood that principles of the invention are not limited to the specific amplifier circuit architectures described herein.

It is to be further understood that circuit descriptions are given below with occasional reference to specific terminals (nodes), e.g., input, output, first, second, return, gate, source, drain, etc., by which a given component is coupled to one or more other components. However, given the functional description herein of each of the components, and their interaction with one another also described in detail herein, one of ordinary skill in the art will realize how each component could be alternatively coupled (i.e., in comparison to what is shown and described in the context of the figures) in order to realize the advantages of the embodiments of the invention. Also, it is to be understood that a transistor terminal designated as a source may function as a drain, and vice versa, depending on how the transistor is connected in the circuit.

Prior to describing various illustrative embodiments of the invention, we describe problems addressed by principles of the invention in the context of FIGS. 1a through 3. We then describe various solutions in accordance with illustrative embodiments of the invention in the context of FIGS. 4 through 11.

There are fundamental relationships between the gain of a direct current (DC) coupled amplifier with a passive load (such as a resistor or capacitor) and the voltage difference between its output common-mode and the power supply voltage.

Figure 1A:
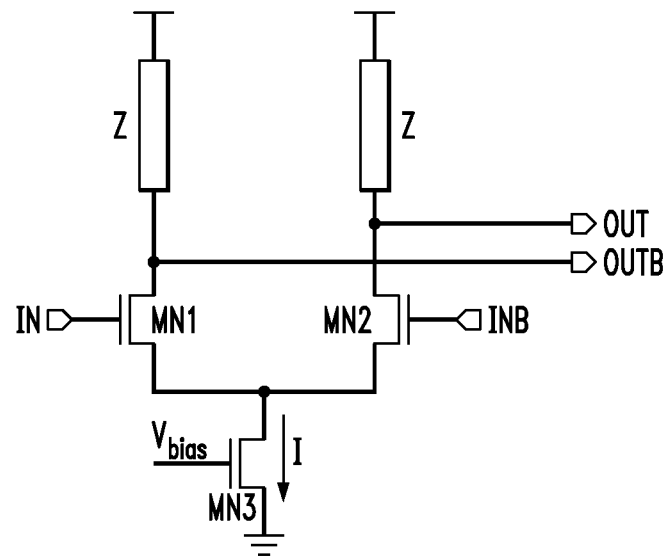
FIG. 1a illustrates an NMOS differential amplifier with passive load.

FIG. 1a shows a commonly used topology of such an amplifier. The amplifier of FIG. 1a comprises n-type metal oxide semiconductor (NMOS) differential transistor pair MN1 and MN2, bias current transistor MN3 connected between the sources of MN1 and MN2, and the power supply return, and load impedance Z connected between the drains of differential pair transistors MN1 and MN2, and the power supply. Note that, as used herein, transistors labeled MNx are NMOS transistors and transistors labeled MPx are p-type MOS (PMOS) transistors.

The gain of this amplifier shown in FIG. 1a is directly proportional to the load impedance (Z) and the transconductance of the input differential transistor pair (MN1 and MN2). The voltage difference between the power supply and the output common-mode voltage of this amplifier is proportional to the bias current (I) and the load impedance (Z). Since the transconductance of the input pair increases with higher bias current (I), the gain and the common-mode drop are closely related. Maintaining linearity of the amplifier requires limiting the common-mode drop at low supply voltages to keep all of its transistors in saturation. This implies either decreasing the bias current (I) or the load impedance (Z), both of which reduce the achievable dc gain of the amplifier.

In principle, higher gain could be achieved if a way could be found to reduce the common-mode voltage drop due to the bias current of the linear amplifier (without reducing the load impedance itself). If equal positive DC currents were injected into the output nodes by current sources ($I_p$), as ideally conceptualized in FIG. 1b, the common-mode would be raised. The higher common-mode could then allow either higher load impedance or an increase in the bias current of the NMOS differential amplifier, either of which would increase the DC gain of the amplifier.

Figure 1B:
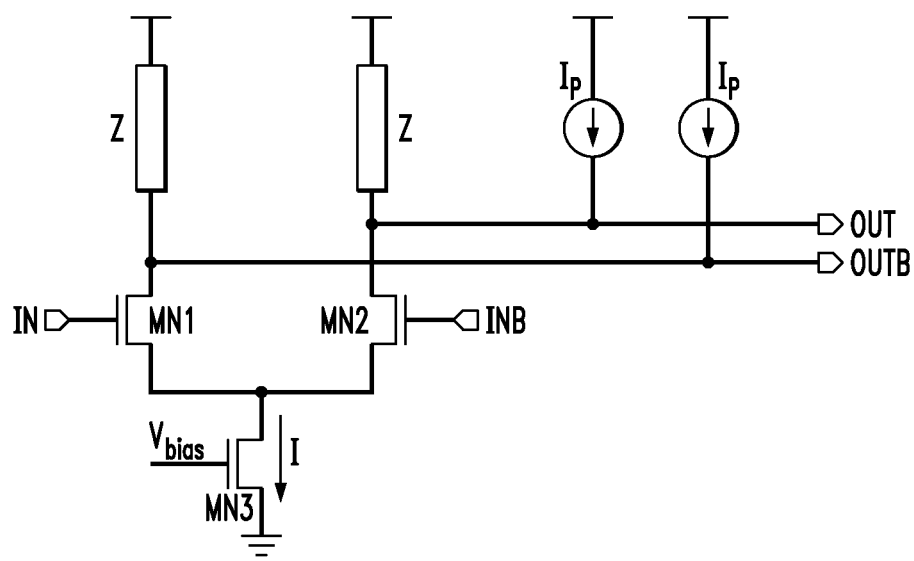

However, practical realization of current sources for positive injection is not straightforward. If the ideal current sources $I_p$ of FIG. 1b are replaced with p-type MOS (PMOS) devices, a minimum voltage drop across the current sources must be maintained at all times to maintain the PMOS devices in saturation. One must then limit the swing of the NMOS differential amplifier so that neither output node approaches too close to the supply voltage. This reduced output swing is a major drawback at low supply voltages, with the result that PMOS current sources are not practically useable in this way to restore the output common-mode of NMOS differential amplifiers.

Furthermore, consider an NMOS current-integrating amplifier (shown in FIG. 2a), with resettable capacitors C1 and C2 as its load. The NMOS current-integrating amplifier of FIG. 2a comprises NMOS differential input pair MN1 and MN2, similar to the differential transistor pair of FIG. 1a. The drains of bias transistors MN4 and MN5 are connected to the sources of differential pair transistors MN1 and MN2, respectively. Resistor R1 is connected between the sources of transistors MN1 and MN2. Reset transistor MP1 is connected to the drain of differential pair transistor MN1 and load capacitor C1. Reset transistor MP2 is connected to the drain of differential pair transistor MN2 and load capacitor C2. Reset transistors MP1 and MP2 charge load capacitors C1 and C2 to the supply voltage during a reset interval.

Figure 2A:
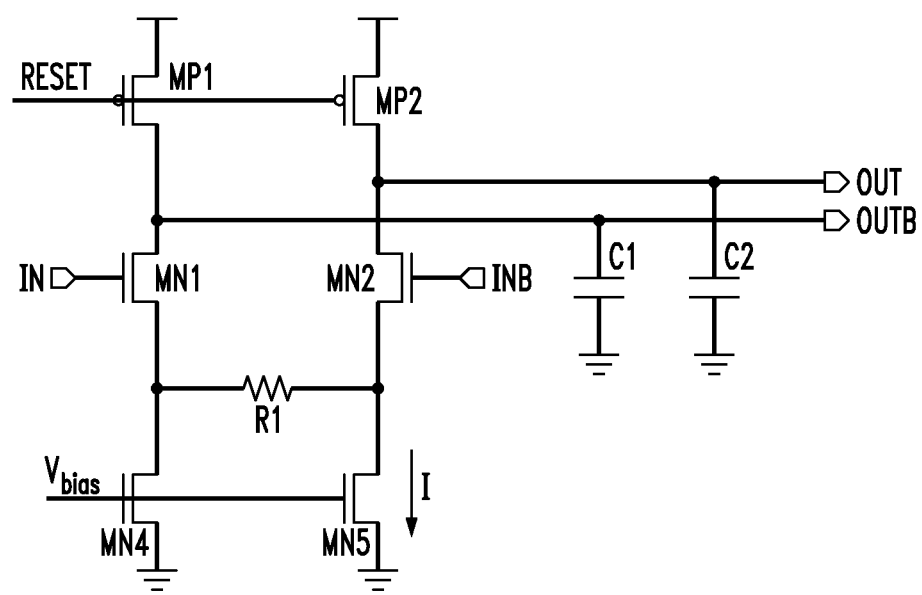
FIG. 2a illustrates an NMOS current-integrating amplifier with capacitive load.
Figure 3:
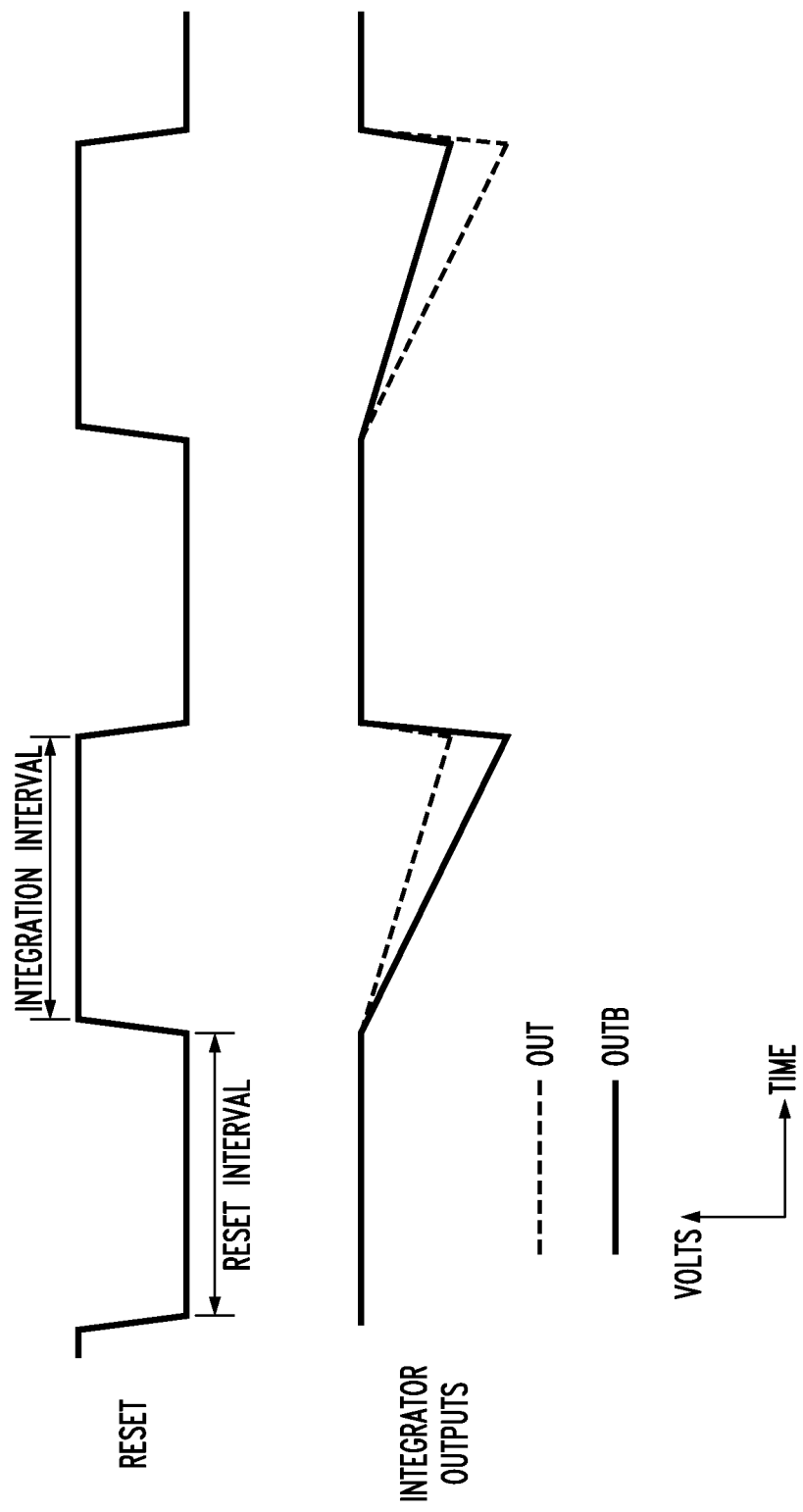

FIG. 3 shows example waveforms that describe the operation of the amplifier circuit in FIG. 2a. During the reset phase, the capacitors C1 and C2 are charged to the supply voltage via reset devices MP1 and MP2. During the integration interval, reset devices MP1 and MP2 are turned off and the currents of the input stage discharge the load capacitors C1 and C2 developing a differential voltage proportional to the input signal and the gain of the stage.

Current-integrating amplifiers with multiple inputs (one linear, one or more binary) are often used as analog summers in decision-feedback equalizers (DFEs) to cancel the inter-symbol interference (ISI) introduced by bandwidth-limited electrical or optical channels in multi-gigabit/s wire-line communication systems. In a DFE, the previously decided bits are fed back with weighted tap coefficients and added to the received input signal. If the magnitudes and polarities of the tap weights are properly adjusted to match the channel characteristics, the ISI from the previous bits in the data stream will be cancelled, and the bits can be detected by a data slicer with a low bit error rate (BER).

Figure 2B:
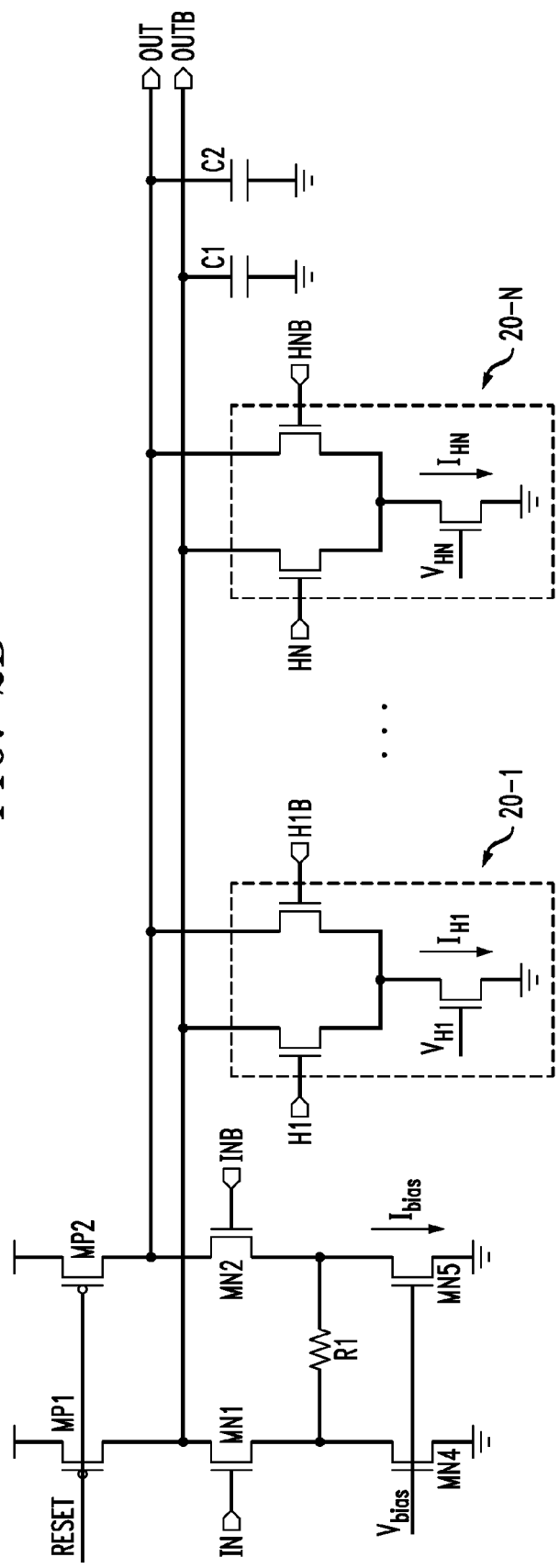
FIG. 2b illustrates an NMOS current-integrating DFE summer.

A schematic of a DFE summer based on current integration is shown in FIG. 2b. Note that FIG. 2b shows the same NMOS current-integrating amplifier as shown in FIG. 2a with the addition of switchable current stages 20-1 through 20-N. Each of the current stages are similar in architecture. For example, current stage 20-N comprises NMOS devices gated by control signals HN and HNB and current source $I_{HN}$. Each current stage (20-1 through 20-N) added to the amplifier output represents a feedback tap to cancel ISI in the incoming data.

The differential gain of the linear stage of this summer in FIG. 2B is given by:

$$G_m \cdot T/C \qquad (1)$$

where $G_m$ is the transconductance of the input stage, T is the duration of integration, and C is the capacitance at the output nodes. The output common-mode drop of this amplifier is given by:

$$I_{bias} * T/C \qquad (2)$$

where $I_{bias}$ is the bias current in each half of the linear stage.

From Eq. (1) and (2) above, it can be seen that the differential gain of the linear stage and its output common-mode drop are tightly coupled. The gain can be increased by increasing the bias current ($I_{bias}$), which in turn increases the transconductance $G_m$, or by increasing the T/C ratio. However, any of these techniques to increase the gain also increases the common-mode drop. Headroom considerations limit the degree to which gain can be increased using these techniques. Another option available to increase the gain of the linear stage of this summer is to increase the ratio of $G_m$ to $I_{bias}$. This can be accomplished by increasing the transistor width of the input pair MN1 and MN2, but this increases the summer's input capacitance, reduces its linear range, and provides diminishing returns, as increasing the transistor widths also increases the load capacitance C1 and C2. These factors limit the achievable differential gain of the linear stage in current-integrating summers.

Figure 2C:
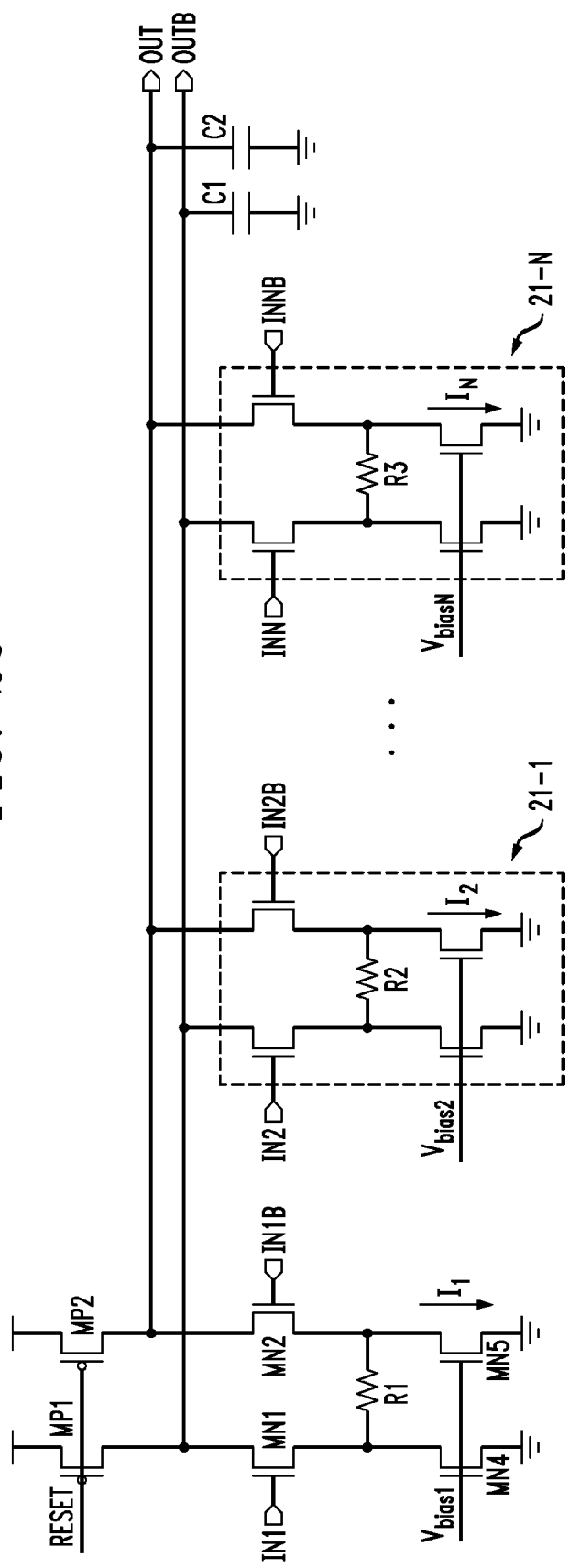
FIG. 2c illustrates an NMOS current-integrating FFE summer.

Current-integrating amplifiers can also be combined to form voltage summers which linearly add together multiple analog inputs, as shown in FIG. 2c. FIG. 2c is similar to FIG. 2a with the addition of a plurality of current-integrating amplifiers 21-1 through 21-N connected in parallel. The output of this summer is a weighted sum of the input voltages, the weights being determined by the transconductance of the input pairs. Such summers can be used to implement transversal filters, such as feed-forward equalizers (FFEs), where the inputs to each of the stages are time-shifted versions of the input signal. In such summers, multiple linear input stages discharge the load capacitors during the integration interval. The output common-mode drop is the sum of the common-mode drops of each of the linear stages. Thus, to avoid driving the input stage devices into the triode region of operation, each linear stage should introduce only a small common-mode drop. Given the relationship between the common-mode drop and the gain of the amplifier discussed above, this imposes a stringent limit on the differential gain achievable by each input stage.

Injecting equal currents into the capacitors C1 and C2 during the integration interval can potentially break this trade-off between the output common-mode drop and differential gain of the linear stages. However, simply connecting PMOS current sources to the output nodes is ineffective because these PMOS transistors have very little head-room and appear as resistive loads to the amplifiers at the beginning of the integration interval when the capacitors start discharging, thereby reducing the differential gain of the amplifier stages.

We now turn to a description of illustrative embodiments that overcome the above and other problems.

Figure 4:
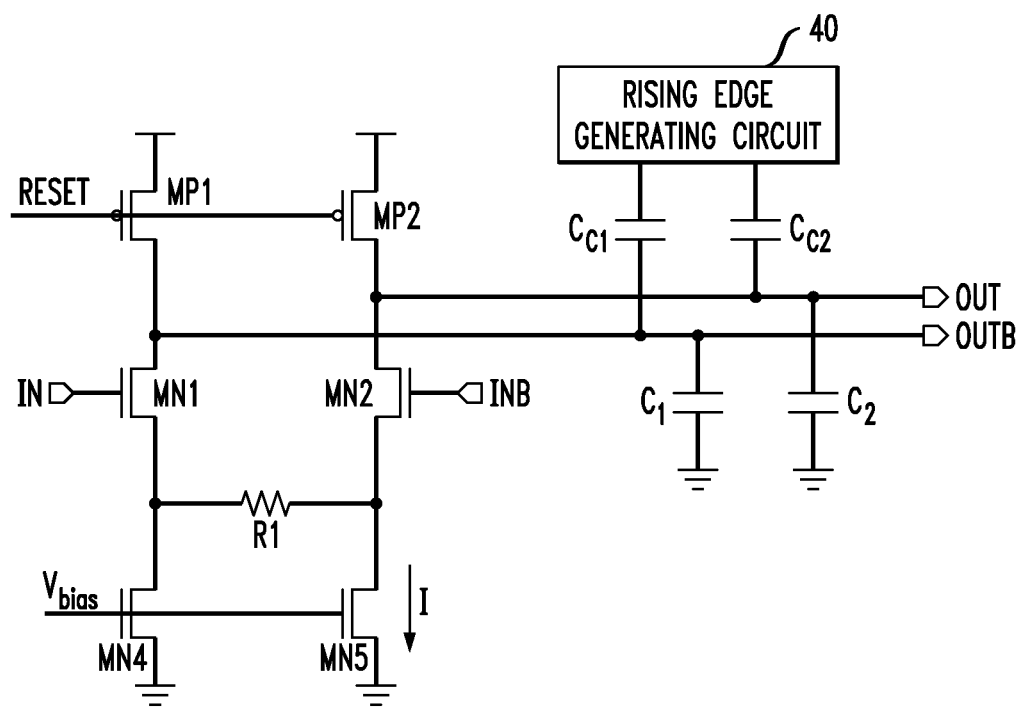
FIG. 4 illustrates a current-integrating amplifier with a common-mode restoration circuit, according to a first embodiment of the invention.

FIG. 4 illustrates a first embodiment of the invention. As shown, the output nodes OUTB and OUT of the current-integrating amplifier from FIG. 2a are coupled by capacitors $C_{C1}$ and $C_{C2}$, respectively, to a circuit 40 that generates rising edges. In accordance with principles of the invention, the rising edges coincide with the integration interval of the current-integrating amplifier and couple with the amplifier's output to partially compensate for the common-mode drop on its output nodes. The rising-edge generation circuit 40 is considered a common-mode restoration (or compensation) circuit.

FIGS. 5a through 5d present waveforms that illustrate the operation of the circuit architecture of FIG. 4. FIG. 5a shows waveforms at the output nodes of the amplifier in the absence of the common-mode restoration circuit. The amplifier produces a differential voltage $V_{diff}1$ while having a common-mode drop of $V_{CM}1$. FIG. 5b shows an example waveform at the output terminals of the rising-edge generation circuit 40. When common-mode restoration is applied at the output of the amplifier in accordance with the invention, the coupling capacitors ($C_{C1}$ and $C_{C2}$ from FIG. 4) combine the two waveforms, resulting in a smaller common-mode drop ($V_{CM}2$) at the output nodes as illustrated in FIG. 5c. Ideally, the common-mode restoration circuit does not hamper the differential gain of the amplifier, and the differential voltage produced ($V_{diff}1$) is the same as before. In practice, it introduces some additional capacitive loading at the output nodes of the summer, reducing the overall achievable gain of the amplifier. The bias current of the amplifier can now be increased such that its common-mode drop is $V_{CM}1$ after common-mode restoration. The increased bias current increases the differential gain of the amplifier and a larger differential voltage ($V_{diff}2$) is obtained at the amplifier output as shown in FIG. 5d.

It is to be appreciated that these inventive principles, as generally illustrated in FIGS. 4 and 5, are applicable to other circuits with a similar principle of operation, for example, the current-integrating DFE summer described in FIG. 2b, and the current-integrating FFE summer described in FIG. 2c. The inventive principles are also applicable to circuits where the input differential pair of the amplifier comprises PMOS transistors. A falling-edge generator circuit is coupled to such circuits to reduce the voltage difference between the output common-mode of the circuit and its ground node. The following descriptions illustrate various additional embodiments of this invention that restore the output common-mode of an NMOS current-integrating amplifier. However, it will be readily apparent to those ordinarily skilled in the art that the general principles defined herein may be applied to other embodiments and applications without departing from the spirit and scope of the present invention.

Figure 6:
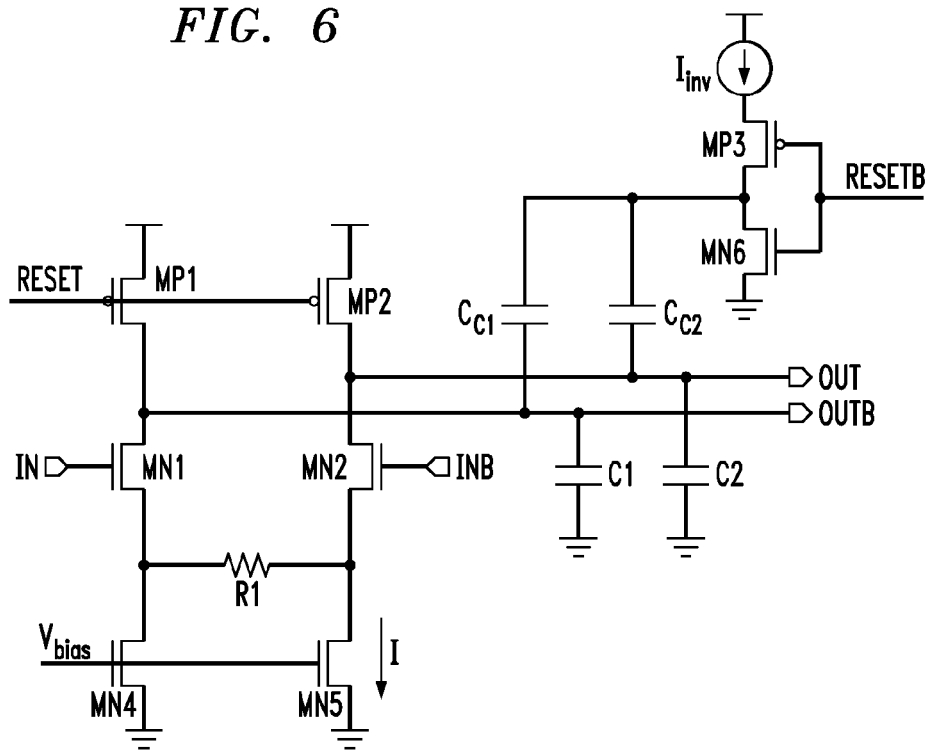
FIG. 6 illustrates a current-integrating amplifier employing a single current-starved inverter for rising-edge generation, according to a second embodiment of the invention.

FIG. 6 depicts another embodiment of the invention. Again, it is assumed that the current-integrating amplifier in FIG. 6 operates as described above with respect to FIG. 2a. However, the circuit in FIG. 6 implements one example of the rising-edge generation circuit 40 (generally depicted in FIG. 4), also referred to as a common-mode restoration (or compensation) circuit. As shown in this implementation, an inverter with a current-starved pull-up, comprised of MOS devices MP3 and MN6, and current source $I_{inv}$, generates rising edges that couple to the output of the amplifier as shown. A signal (resetb) complementary to the reset signal of the amplifier is input to the inverter, causing the rising edge of the inverter to coincide with the integration phase of the amplifier. Varying the current $I_{inv}$ varies the slew rate of the rising edge and controls the strength of the common-mode restoration signal injected onto the outputs of the amplifier. The inverter couples to the output nodes, OUT and OUTB, through capacitors $C_{C1}$ and $C_{C2}$. Because $C_{C1}$ and $C_{C2}$ share a common terminal, they present a differential capacitive load to the output nodes, which reduces the gain of the amplifier.

Figure 7:
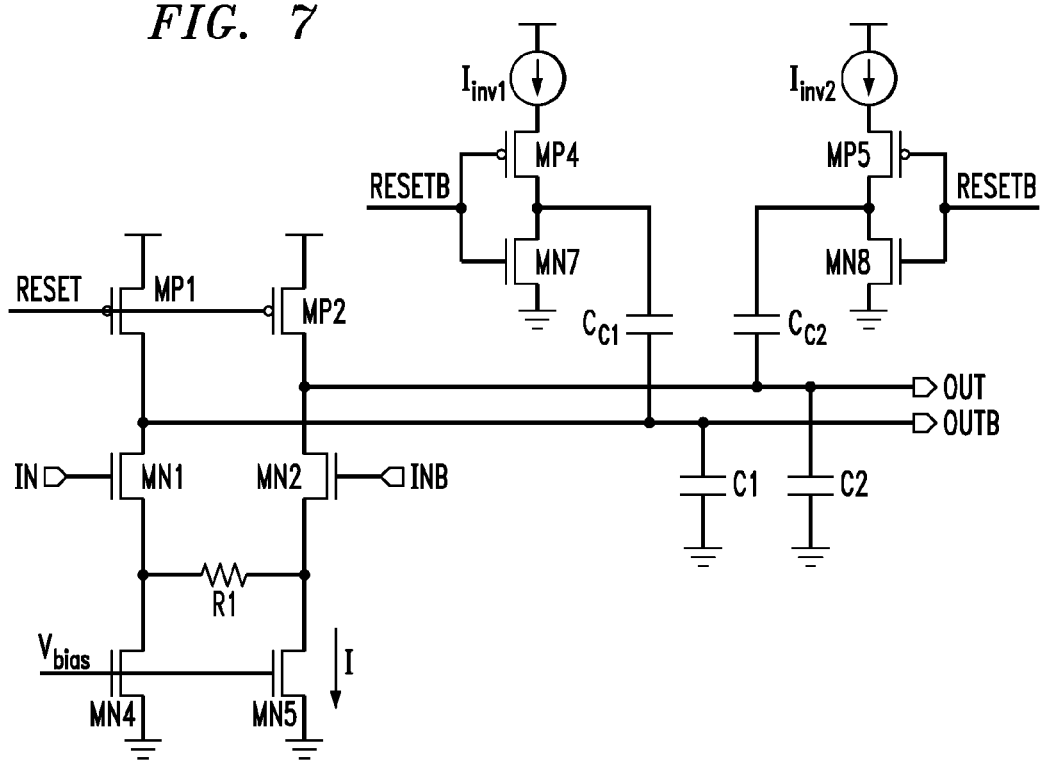
FIG. 7 illustrates a current-integrating amplifier employing two current-starved inverters for rising-edge generation, according to a third embodiment of the invention.

FIG. 7 illustrates an embodiment of the invention that improves upon the embodiment of FIG. 6. Two separate rising-edge generation circuits, each implemented as an inverter with current-starved pull-up, couple to the OUT and OUTB nodes of the amplifier, respectively. The first rising-edge generation circuit comprises transistors MP4 and MN7 and current source $I_{inv1}$, and the second rising-edge restoration circuit comprises transistors MP5 and MN8 and current source $I_{inv2}$. The two rising-edge generation circuits are cumulatively considered a common-mode restoration (or compensation) circuit.

In this embodiment, the coupling capacitors do not load the amplifiers because they appear in series with the high-impedance current sources when looking into the coupling capacitors from the output nodes. Only the parasitic capacitances to ground of the coupling capacitors present a small additional capacitive load to the output nodes, resulting in smaller reduction in the differential gain of the amplifier.

In the circuit of FIG. 7, the rising-edge generation circuits can also be viewed as current sources that inject common-mode current into the output nodes of the amplifier. The coupling capacitors, $C_{C1}$ and $C_{C2}$, act as dc blocks or level-shifters, keeping both the PMOS current sources and the NMOS devices in the amplifier in saturation. The common-mode restoration (compensation) circuit affects only the common-mode of the amplifier if the two current sources $I_{inv1}$ and $I_{inv2}$ are equal. Any imbalance in these current sources also introduces an additional differential voltage that couples to the output of the amplifier. This can be used to intentionally add differential signals to the output to perform offset cancellation of the amplifier.

Figure 8:
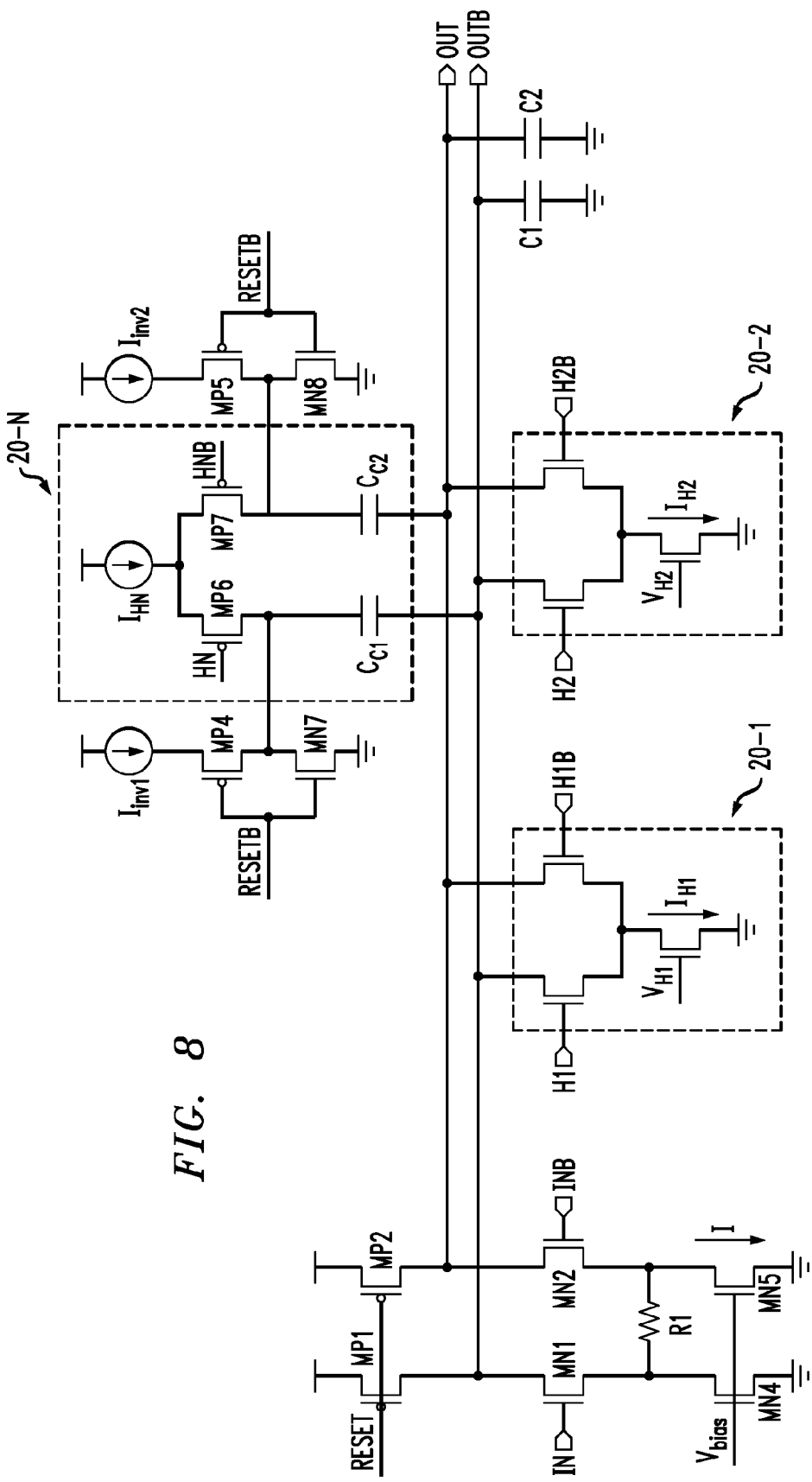
FIG. 8 illustrates a current-integrating amplifier employing differential current switches for implementing DFE feedback taps within a common-mode restoration circuit, according to a fourth embodiment of the invention.

Another potential use of differential signal generation by a common-mode restoration circuit of the invention arises in realizing a current-integrating summer for a DFE. Recall that FIG. 2b illustrates a DFE summer with multiple feedback taps (20-1 through 20-N) in the NMOS summer. In accordance with one embodiment of the invention, one or more feedback taps can be migrated to the PMOS current-injection circuit of FIG. 7 by moving one or more of the differential current switches 20-1 and 20-N to the common-mode restoration circuit as illustrated in the embodiment of FIG. 8. As shown in FIG. 8, current switch 20-N is now part of the PMOS current-injection circuit (common-mode restoration circuit). Just as with the feedback taps on the NMOS summer, the current switch of PMOS current injection circuit, comprising for example transistors MP6 and MP7 and current source $I_{HN}$, is driven by bits representing previous data decisions.

Figure 9:
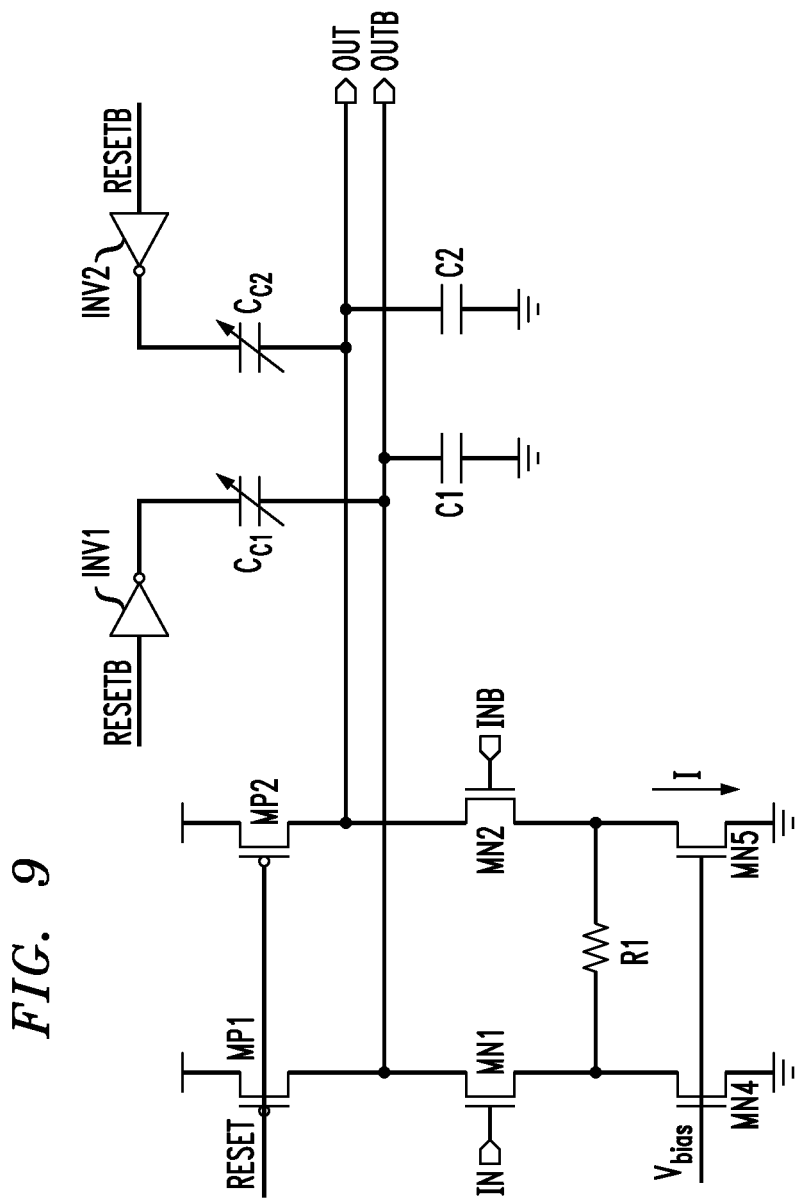
FIG. 9 illustrates a current-integrating amplifier employing two inverters for rising-edge generation, according to a fifth embodiment of the invention.

A further embodiment of the invention, illustrated in FIG. 9, relies only on adjusting the magnitude of the coupling capacitors $C_{C1}$ and $C_{C2}$ to control the amount of common-mode restoration. It replaces current-starved inverters with simple inverters INV1 and INV2 for rising-edge generation. These inverters produce fast rising edges that couple to the output nodes, producing common-mode uplift at these nodes. If the uplift occurs soon after the beginning of the integration phase, when the output-common-mode is close to the supply voltage, the instantaneous voltage at the output nodes can go higher than the supply voltage, creating voltage stress on the devices. Thus, care should be taken to sufficiently delay the rising edge of the inverters to prevent voltage overshoot at the output nodes of the amplifier. A differential signal can be introduced on top of the common-mode compensation signal by creating an imbalance between the magnitudes of capacitance $C_{C1}$ and $C_{C2}$. This additional differential signal may cancel the offset in the amplifier. If the capacitors are switched in a data-dependent manner (where presence or absence of switching depends on previous data decisions), a DFE tap can be realized within the PMOS common-mode restoration circuit. This provides a method of migrating DFE feedbacks taps to the common-mode restoration circuit, which is an alternative to the current switching method of FIG. 8. To implement data-dependent switching of the capacitors, INV1 and INV2 can be replaced by simple gating logic circuits.

Figure 10:
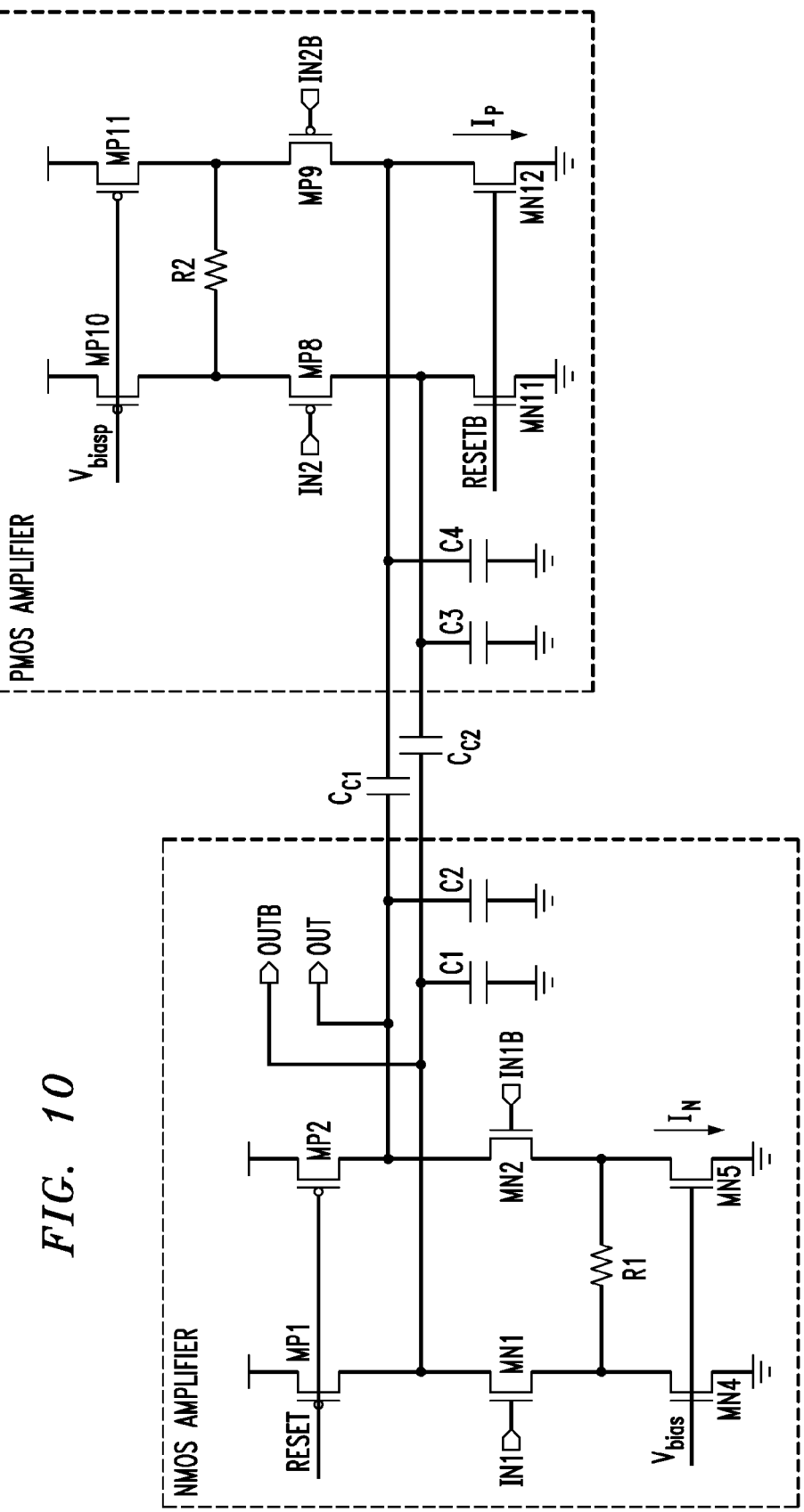
FIG. 10 illustrates coupled NMOS and PMOS amplifiers for common-mode restoration of each amplifier, according to a sixth embodiment of the invention.

Yet another embodiment of the invention, presented in FIG. 10, combines complementary current-integrating amplifiers by capacitive coupling to reduce common-mode movement on both sides. The positive and negative output terminals of the NMOS amplifier of FIG. 2a are coupled with the positive and negative output terminals of the PMOS amplifier respectively, as shown in FIG. 10. The PMOS amplifier is comprised of transistors MP8 through MP11 and MN11 and MN12, as shown.

In a preferred embodiment, the bias currents and device sizes in both amplifiers are adjusted to ensure matching between the two amplifiers. The input signals to the two amplifiers have the same differential magnitude, but may be offset in common-mode to optimize the DC operating points of the amplifiers. If the differential signals produced at the outputs of the PMOS and NMOS amplifiers are equal, coupling them together capacitively does not reduce the differential signals, so a high differential gain is preserved. On the other hand, the common-mode movements of the amplifiers are averaged by the coupling, thereby alleviating the common-mode drop on each amplifier. The strength of the coupling can be controlled by adjusting the magnitude of the coupling capacitors $C_{C1}$ and $C_{C2}$.

In another embodiment, the PMOS current-integrating amplifier circuit comprises one or more input stages whose inputs are time-shifted and DC level-shifted versions of the input to the NMOS current-integrating amplifier. This can be used to implement an FFE summer of FIG. 2C with one or more of the current-integrating amplifiers 21-1 through 21-N migrated to a common-mode restoration circuit that is capacitively coupled to the output nodes of the NMOS FFE summer.

It is to be appreciated that while the current-integrating amplifier circuits described above in the context of the figures are illustrated as differential amplifiers, the capacitively coupled common-mode restoration techniques of the invention can readily be applied to single-ended amplifier circuits.

It is also to be appreciated that all or portions of the current-integrating amplifiers with common-mode restoration circuits of the present invention may be implemented in one or more integrated circuits. As is well known, in forming integrated circuits, a plurality of identical die are typically fabricated in a repeated pattern on a surface of a semiconductor wafer. Each die includes a device described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

Figure 11:
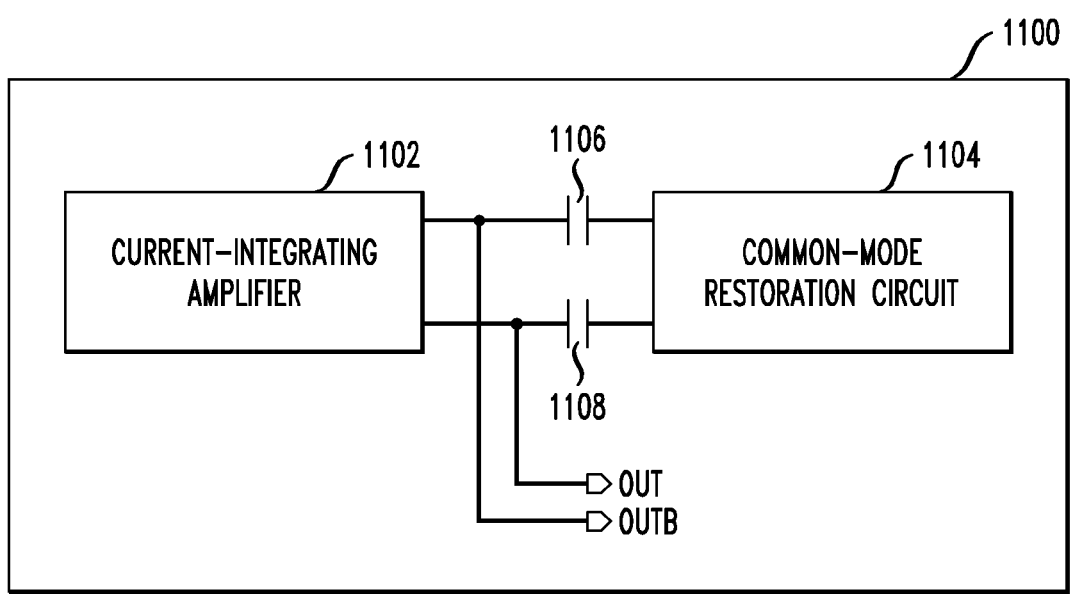
FIG. 11 illustrates an integrated circuit comprising a current-integrating amplifier coupled to a common-mode restoration circuit.

FIG. 11 illustrates an integrated circuit 1100 comprising current-integrating amplifier 1102 and common-mode restoration circuit 1104. The outputs, OUT and OUTB, of current-integrating amplifier 1102 are capacitively coupled, via capacitors 1106 and 1108, to the common-mode restoration circuit 1104. Common-mode restoration circuit 1104 is operative to restore the common-mode drop of the current-integrating amplifier 1102 in accordance with one or more of the implementations illustratively described herein.

Advantageously, as has been illustratively described in detail herein, principles of the invention provide injecting signals into the output nodes of an amplifier by capacitively coupling these output nodes to the source(s) of the signals, wherein the signals have a complementary movement of the common-mode. The techniques are particularly well-suited to reducing the rate of common-mode drop on the output nodes of current-integrating amplifiers. The restoration of output common-mode improves the gain and linearity of amplifiers operating off low supply voltages. For example, in accordance with one embodiment of the invention, a method is provided for compensating for the common-mode drop on the output nodes of a current-integrating amplifier by capacitively coupling the output nodes to a circuit that generates rising edges. The rising edges coincide with the integration interval of the current-integrating amplifier. In accordance with another embodiment of the invention, a single current-starved inverter is utilized to generate the rising edges. In accordance with a further embodiment of the invention, two current starved inverters are utilized to generate the rising edges. In accordance with yet another embodiment of the invention, differential current switches are utilized for implementing DFE feedback taps within the common-mode restoration circuit. In accordance with yet a further embodiment of the invention, two simple inverters are utilized to generate the rising edges. In accordance with still a further embodiment of the invention, capacitively coupled NMOS and PMOS amplifiers are utilized for common-mode restoration of each amplifier. Other alternative embodiments have also been presented.

It will be appreciated and should be understood that the exemplary embodiments of the invention described above can be implemented in a number of different fashions. Given the teachings of the invention provided herein, one of ordinary skill in the related art will be able to contemplate other implementations of the invention. Indeed, although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. An apparatus, comprising:
an amplifier circuit comprising at least one output node; and
a common-mode restoration circuit capacitively coupled to the at least one output node of the amplifier circuit and configured to generate and apply at least one common-mode restoring signal onto the output node via the capacitive coupling, wherein the at least one common-mode restoring signal transitions in correspondence with an operation interval of the amplifier circuit and thereby compensates for a common-mode voltage drop on the at least one output node of the amplifier circuit, and wherein the common-mode restoration circuit generates the at least one common-mode restoring signal without an analog input signal applied to the common-mode restoration circuit.

2. The apparatus of claim 1, wherein the amplifier circuit comprises a current-integrating amplifier circuit, and the operation interval comprises an integration interval.

3. The apparatus of 2, wherein the transition of the common-mode restoring signal is complementary to the common-mode voltage drop on the at least one output node during the integration interval of the current-integrating amplifier circuit.

4. The apparatus of claim 3, wherein the transition of the common-mode restoring signal comprises one of a rising edge transition and a falling edge transition.

5. The apparatus of claim 2, wherein the current-integrating amplifier circuit comprises a differential amplifier with two output nodes such that the common-mode restoration circuit introduces two common-mode restoring signals onto the two output nodes, respectively.

6. The apparatus of claim 5, wherein the common-mode restoration circuit comprises a single current-starved inverter to generate the two common-mode restoring signals.

7. The apparatus of claim 5, wherein the common-mode restoration circuit comprises two current-starved inverters to generate the two common-mode restoring signals, respectively.

8. The apparatus of claim 5, wherein the common-mode restoration circuit comprises at least one differential current switch, wherein the at least one differential current switch represents at least one feedback tap of a decision feedback equalizer summer circuit.

9. The apparatus of claim 5, wherein the common-mode restoration circuit comprises two simple gating logic circuits to generate the two common-mode restoring signals, respectively.

10. The apparatus of claim 2, wherein the current-integrating amplifier circuit comprises a multi-input amplifier that sums multiple input signals to implement one of a decision feedback equalizer summer circuit and a feed-forward equalizer summer circuit.

11. A method, comprising:
applying at least one common-mode restoring signal onto at least one output node of an amplifier circuit capacitively coupled to a common-mode restoration circuit, wherein the at least one common-mode restoring signal is generated by the common-mode restoration circuit without an analog input signal applied to the common-mode restoration circuit, and applied to the output node via the capacitive coupling, and wherein the at least one common-mode restoring signal transitions in correspondence with an operation interval of the amplifier circuit and thereby compensates for a common-mode voltage drop on the at least one output node of the amplifier circuit.

12. The method of claim 11, wherein the amplifier circuit comprises a current-integrating amplifier circuit, and the operation interval comprises an integration interval.

13. The method of 12, wherein the transition of the common-mode restoring signal is complementary to the common-mode voltage drop on the at least one output node during the integration interval of the current-integrating amplifier circuit.

14. The method of claim 13, wherein the transition of the common-mode restoring signal comprises one of a rising edge transition and a falling edge transition.

15. The method of claim 12, wherein the current-integrating amplifier circuit comprises a differential amplifier with two output nodes such that the common-mode restoration circuit introduces two common-mode restoring signals onto the two output nodes, respectively.

16. The method of claim 15, wherein the common-mode restoration circuit comprises a single current-starved inverter to generate the two common-mode restoring signals.

17. The method of claim 15, wherein the common-mode restoration circuit comprises two current-starved inverters to generate the two common-mode restoring signals, respectively.

18. The method of claim 15, wherein the common-mode restoration circuit comprises at least one differential current switch, wherein the at least one differential current switch represents at least one feedback tap of a decision feedback equalizer summer circuit.

19. The method of claim 15, wherein the common-mode restoration circuit comprises two simple gating logic circuits to generate the two common-mode restoring signals, respectively.

20. The method of claim 12, wherein the current-integrating amplifier circuit comprises a multi-input amplifier that sums multiple input signals to implement one of a decision feedback equalizer summer circuit and a feed-forward equalizer summer circuit.

21. One or more integrated circuits, comprising:
    an amplifier circuit portion of the one or more integrated circuits comprising at least one output node; and
    a common-mode restoration circuit portion of the one or more integrated circuits capacitively coupled to the at least one output node of the amplifier circuit portion and configured to generate and apply at least one common-mode restoring signal onto the output node via the capacitive coupling, wherein the at least one common-mode restoring signal transitions in correspondence with an operation interval of the amplifier circuit portion and thereby compensates for a common-mode voltage drop on the at least one output node of the amplifier circuit portion, and wherein the common-mode restoration circuit portion generates the at least one common-mode restoring signal without an analog input signal applied to the common-mode restoration circuit portion.

22. The one or more integrated circuits of claim 21, wherein the amplifier circuit portion comprises a current-integrating amplifier circuit portion, and the operation interval comprises an integration interval.

23. The one or more integrated circuits of 22, wherein the transition of the common-mode restoring signal is complementary to the common-mode voltage drop on the at least one output node during the integration interval of the current-integrating amplifier circuit portion.

* * * * *